(12) United States Patent
Tseng

(10) Patent No.: US 12,543,315 B2
(45) Date of Patent: Feb. 3, 2026

(54) THREE-DIMENSIONAL MEMORY DEVICE WITH LOW RESISTANCE BUFFER PILLAR

(71) Applicant: MACRONIX International Co., Ltd., Hsinchu (TW)

(72) Inventor: Pi-Shan Tseng, Tainan (TW)

(73) Assignee: MACRONIX International Co., Ltd., Hsinchu (TW)

( * ) Notice: Subject to any disclaimer, the term of this patent is extended or adjusted under 35 U.S.C. 154(b) by 410 days.

(21) Appl. No.: 18/163,299

(22) Filed: Feb. 2, 2023

(65) Prior Publication Data

US 2024/0268111 A1   Aug. 8, 2024

(51) Int. Cl.
| | |
|---|---|
| H10B 43/27 | (2023.01) |
| H10B 41/10 | (2023.01) |
| H10B 41/27 | (2023.01) |
| H10B 41/35 | (2023.01) |

(Continued)

(52) U.S. Cl.
CPC ............ H10B 43/27 (2023.02); H10B 41/10 (2023.02); H10B 41/27 (2023.02); H10B 41/35 (2023.02); H10B 43/10 (2023.02); H10B 43/35 (2023.02)

(58) Field of Classification Search
CPC . H01L 27/1027; H01L 27/1028; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00;
(Continued)

(56) References Cited

U.S. PATENT DOCUMENTS

| | | | | |
|---|---|---|---|---|
| 2017/0148517 A1* | 5/2017 | Harari | ................. | H10D 62/83 |
| 2020/0381450 A1* | 12/2020 | Lue | ..................... | H10D 30/69 |
| 2021/0391354 A1* | 12/2021 | Sun | ..................... | H10B 43/27 |

(Continued)

FOREIGN PATENT DOCUMENTS

TW   202306123   2/2023

OTHER PUBLICATIONS

"Office Action of Taiwan Counterpart Application", issued on Dec. 29, 2023, pp. 1-6.

*Primary Examiner* — William B Partridge
*Assistant Examiner* — Gustavo G Ramallo
(74) *Attorney, Agent, or Firm* — J.C. PATENTS

(57) ABSTRACT

Provided is a three-dimensional (3D) memory device including: a substrate, a stack structure, and a vertical channel pillar. The stack structure is disposed on the substrate. The stack structure includes a plurality of dielectric layers and a plurality of gate layers stacked alternately. The vertical channel pillar penetrates through the stack structure. The vertical channel pillar includes a first source/drain pillar and a channel layer laterally surrounding the first source/drain pillar. The first source/drain pillar includes a first buffer pillar and a first semiconductor layer having a first conductivity type wrapping the first buffer pillar. The channel layer includes a polysilicon layer having a second conductivity type different from the first conductivity type. In some embodiments, the 3D memory device may be, but is not limited to, a AND flash memory.

10 Claims, 13 Drawing Sheets

(51) Int. Cl.
  *H10B 43/10*   (2023.01)
  *H10B 43/35*   (2023.01)
(58) Field of Classification Search
  CPC ........ H10B 51/10; H10B 51/20; H10B 51/30; H10B 51/40; H10B 51/50
  See application file for complete search history.

(56) References Cited

U.S. PATENT DOCUMENTS

| | | | |
|---|---|---|---|
| 2022/0130862 A1* | 4/2022 | Lue | H10B 41/10 |
| 2022/0157848 A1* | 5/2022 | Lue | H10B 43/27 |
| 2022/0384486 A1* | 12/2022 | Jiang | H10B 51/10 |
| 2022/0399354 A1 | 12/2022 | Sharangpani et al. | |
| 2023/0058855 A1* | 2/2023 | Liang | H01L 23/5226 |

* cited by examiner

THREE-DIMENSIONAL MEMORY DEVICE WITH LOW RESISTANCE BUFFER PILLAR

BACKGROUND OF THE INVENTION

Field of the Invention

The present invention relates to a semiconductor device and a method of forming the same, and more particularly to a three-dimensional (3D) memory device and a method of forming the same.

Description of Related Art

A non-volatile memory (such as a flash memory) is a memory widely used in personal computers and other electronic devices because it has an advantage that the stored data does not disappear after being powered off.

The 3D flash memory currently used in the industry includes a NOR flash memory and a NAND type flash memory. In addition, another type of 3D flash memory is an AND type flash memory, which can be applied to a multi-dimensional flash memory array with high integration and high area utilization, and has an advantage of fast operation speed. Therefore, the development of the 3D flash memory has gradually become the current trend.

SUMMARY OF THE INVENTION

The invention provides a three-dimensional (3D) memory device that uses buffer pillars as source/drain pillars to reduce the resistance value of the source/drain pillars, thereby increasing the operating speed of the device.

The invention provides a method for forming a 3D memory device, which is compatible with current semiconductor processes and is suitable for manufacturing various 3D memory devices, such as 3D AND flash memory, 3D NAND flash memory, or 3D NOR flash memory.

The invention provides a three-dimensional (3D) memory device including: a substrate, a stack structure, and a vertical channel pillar. The stack structure is disposed on the substrate. The stack structure includes a plurality of dielectric layers and a plurality of gate layers stacked alternately. The vertical channel pillar penetrates through the stack structure. The vertical channel pillar includes a first source/drain pillar, a second source/drain pillar, and a channel layer laterally surrounding the first source/drain pillar and the second source/drain pillar. The first source/drain pillar includes a first buffer pillar and a first semiconductor layer having a first conductivity type wrapping the first buffer pillar. The second source/drain pillar includes a second buffer pillar and a second semiconductor layer having the first conductivity type wrapping the second buffer pillar. The channel layer includes a polysilicon layer having a second conductivity type different from the first conductivity type.

In an embodiment of the invention, the first source/drain pillar further comprises a first barrier layer disposed between the first buffer pillar and the first semiconductor layer.

In an embodiment of the invention, the first semiconductor layer is in contact with the channel layer, the first semiconductor layer has positive charge carriers and the channel layer has negative charge carriers.

In an embodiment of the invention, the second source/drain pillar further includes a second barrier layer disposed between the second buffer pillar and the second semiconductor layer.

In an embodiment of the invention, the second semiconductor layer is in contact with the channel layer, the second semiconductor layer has positive charge carriers and the channel layer has negative charge carriers.

In an embodiment of the invention, a thickness of the first semiconductor layer is 5 nm to 100 nm, and a thickness of the second semiconductor layer is 5 nm to 100 nm.

In an embodiment of the invention, the first buffer pillar has a bottom surface lower than a bottom surface of the stack structure.

In an embodiment of the invention, the first buffer pillar has a bottom surface between a top surface and a bottom surface of the stack structure.

In an embodiment of the invention, the first semiconductor layer comprises: a lower portion having a top surface and a bottom surface opposite to each other, the top surface of the lower portion in contact with the bottom surface of the first buffer pillar, and the bottom surface of the lower portion lower than the bottom surface of the stack structure; and an upper portion laterally surrounding a sidewall of the first buffer pillar.

In an embodiment of the invention, a ratio (H1/H2) of a height H1 of the lower portion to a height H2 of the first buffer pillar is between 0.01 and 0.99.

In an embodiment of the invention, a resistance value of the first buffer pillar is lower than a resistance value of the first semiconductor layer.

The invention provides a method of forming a three-dimensional (3D) memory device including: forming an stop layer and a stack structure on a substrate, wherein the stack structure comprises a plurality of dielectric layers and a plurality of sacrificial layers stacked alternately; forming a first opening in the stack structure and the stop layer; forming a vertical channel pillar in the first opening, wherein the vertical channel pillar comprises: a first source/drain pillar comprising a first buffer pillar and a first semiconductor layer having a first conductivity type wrapping the first buffer pillar; and a channel layer laterally surrounding the first source/drain pillar, wherein the channel layer comprises a polysilicon layer having a second conductivity type different from the first conductivity type; and performing a gate replacement process to replace the plurality of sacrificial layers by a plurality of gate layers.

In an embodiment of the invention, the forming the vertical channel pillar comprises: forming the channel layer on a sidewall of the first opening; filling a dielectric material into the first opening, so that the channel layer laterally surrounds the dielectric material; forming a second opening and a third opening in the dielectric material, wherein the channel layer is exposed by the second and third openings; and forming the first source/drain pillar in the second opening and a second source/drain pillar in the third opening, wherein the channel layer laterally surrounds the first and second source/drain pillars.

In an embodiment of the invention, the second source/drain pillar comprises: a second buffer pillar; a second semiconductor layer having the first conductivity type wrapping the second buffer pillar; and a second barrier layer disposed between the second buffer pillar and the second semiconductor layer.

In an embodiment of the invention, the second semiconductor layer is in contact with the channel layer, and the second semiconductor layer is configured to prevent a carrier from moving between the second buffer pillar and the channel layer in an off-stage.

In an embodiment of the invention, the forming the first source/drain pillar in the second opening comprises: forming a lower semiconductor layer in the second opening, wherein the lower semiconductor layer has a top surface between a top surface and a bottom surface of the stack structure; forming a semiconductor material to conformally cover the second opening and contact the top surface of the lower semiconductor layer; forming a metal material to fill in the second opening; and performing an etch-back process to remove the metal material and the semiconductor material on the top surface of the stack structure, thereby forming the first buffer pillar and an upper semiconductor layer laterally surrounding a sidewall of the first buffer pillar in the second opening.

In an embodiment of the invention, a ratio (H1/H2) of a height H1 of the lower semiconductor layer to a height H2 of the first buffer pillar is between 0.01 and 0.99.

In an embodiment of the invention, the first source/drain pillar further comprises a first barrier layer disposed between the first buffer pillar and the first semiconductor layer.

In an embodiment of the invention, the first semiconductor layer is in contact with the channel layer, and the first semiconductor layer is configured to prevent a carrier from moving between the first buffer pillar and the channel layer in an off-stage.

In an embodiment of the invention, a resistance value of the first buffer pillar is lower than a resistance value of the first semiconductor layer.

Based on the above, in the present invention, a 3D memory device is provided to have a source/drain pillar which may include a buffer pillar and a semiconductor layer wrapping the buffer pillar. Using the buffer pillar with the low-resistance as the source/drain pillar can effectively reduce the resistance of the source/drain pillar, thereby increasing the operating speed of the device. In addition, the semiconductor layer may be formed between the buffer pillar and the channel layer and in contact with the channel layer, and the semiconductor layer may be designed to have a conductivity type different from that of the channel layer. In this case, the semiconductor layer can be configured to prevent the carrier from moving between the buffer pillar and the channel layer in the off-stage, so as to effectively reduce the leakage current of the device, thereby improving the device performance.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
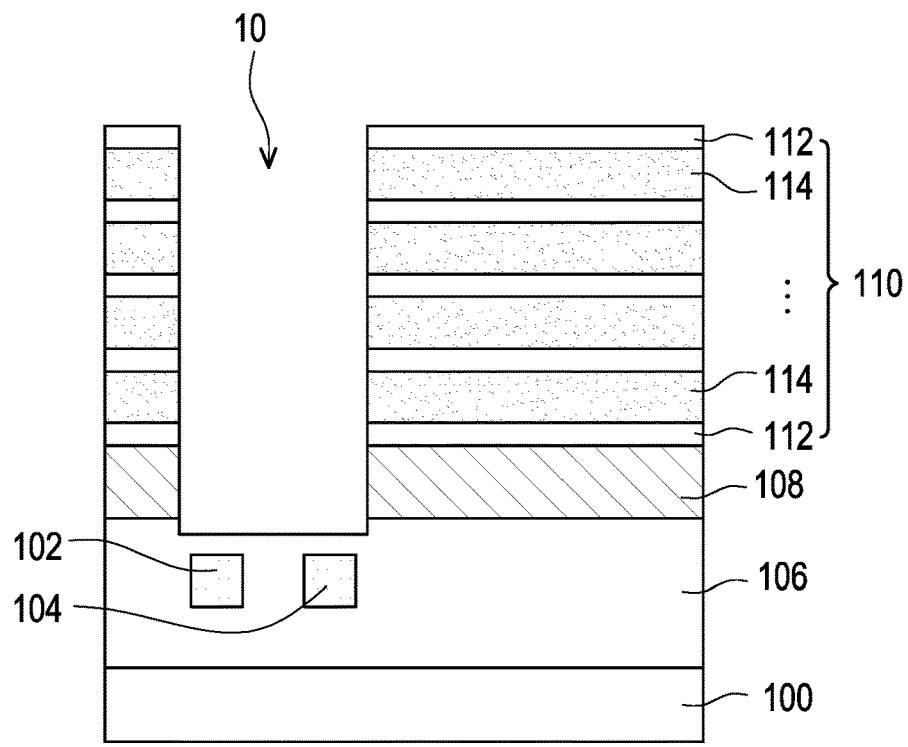
FIG. 1A to FIG. 1I are schematic cross-sectional views of a manufacturing process of a 3D memory device according to an embodiment of the invention.

The invention is more blanketly described with reference to the figures of the present embodiments. However, the invention can also be implemented in various different forms, and is not limited to the embodiments in the present specification. The thicknesses of the layers and regions in the figures are enlarged for clarity. The same or similar reference numerals represent the same or similar devices and are not repeated in the following paragraphs.

In the following embodiments, when the first conductivity type is N-type, the second conductivity type is P-type; when the first conductivity type is P-type, the second conductivity type is N-type. The P-type dopants are, for example, boron; while the N-type dopants are, for example, phosphorus or arsenic. In the present embodiment, the first conductivity type is P-type and the second conductivity type is N-type as an example to illustrate, but the present invention is not limited thereto.

FIG. 1A to FIG. 1I are schematic cross-sectional views of a manufacturing process of a 3D memory device according to an embodiment of the invention The following embodiment is illustrated by using the 3D memory device as an AND flash memory as an example, but the invention is not limited thereto.

Referring to FIG. 1A, first, a substrate 100 is provided. In some embodiments, the substrate 100 is, for example, a semiconductor substrate, a semiconductor compound substrate, or a semiconductor over insulator (SOI) substrate. In the present embodiment, the substrate 100 may be a silicon substrate. Next, a dielectric layer 106 is formed on the substrate 100. In an embodiment, the dielectric layer 106 may be a silicon oxide layer.

Next, polysilicon layers 102 and 104 are formed in the dielectric layer 106. In an embodiment, a method for forming the polysilicon layers 102 and 104 may include: forming openings in the dielectric layer 106; forming a polysilicon material in the openings; and performing a planarization process on the polysilicon material. In an embodiment, the polysilicon layers 102 and 104 may have the same material, such as a doped polysilicon material. For example, the polysilicon layers 102 and 104 may be N-type doped (N+) polysilicon layers.

Thereafter, a stop layer 108 is formed on the dielectric layer 106. In an embodiment, a material of the stop layer 108 includes a doped or an undoped polysilicon material. For example, the stop layer 108 may be a P-type doped (P+) polysilicon layer. In alternative embodiments, the stop layer 108 includes a high work function material, such as a material of a work function greater than 4 eV. In other embodiments, the stop layer 108 may be a material of a work function greater than 4.5 eV. In other embodiments, the stop layer 108 and the polysilicon layers 102 and 104 may have different conductivity types.

Then, a stack structure 110 is formed on the stop layer 108. Specifically, the stack structure 110 includes a plurality of dielectric layers 112 and a plurality of sacrificial layers 114 stacked alternately. In an embodiment, the dielectric layers 112 and the sacrificial layers 114 may be different dielectric materials. For example, the dielectric layers 112 may be silicon oxide layers; and the sacrificial layers 114 may be silicon nitride layers. In an embodiment, the number of the dielectric layers 112 and the sacrificial layers 114 may be 8 layers, 16 layers, 32 layers, 64 layers or more layers.

Next, an opening 10 (also referred to as a first opening) is formed in the stack structure 110. As shown in FIG. 1A, the opening 10 penetrates through the stack structure 110 and the stop layer 108, and stops on the dielectric layer 106. In an embodiment, the stop layer 108 may be regarded as an etching stop layer for forming the opening 10, so as to avoid over-etching. In this case, the opening 10 maybe regarded as a vertical channel hole. In one embodiment, the opening 10 has a circular profile in the top view, but the present invention is not limited thereto. In other embodiments, the opening 10 may have profiles of other shapes, such as an ellipse, a rectangle, a polygon, or a combination thereof.

Figure 1B:
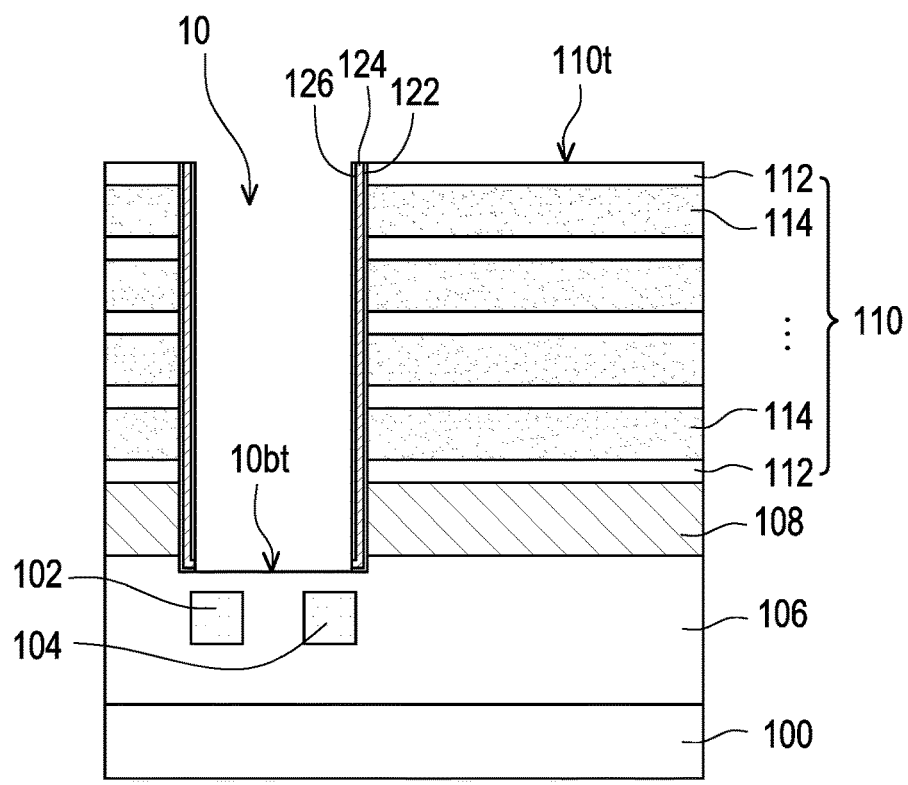

Referring to FIG. 1B, a dielectric layer 122, a channel layer 124, and a dielectric layer 126 are sequentially formed on the sidewall of the opening 10. Specifically, a first dielectric material may be first formed to conformally cover the surface of the opening 10 and extend to cover a top surface 110t of the stack structure 110; a channel material is conformally formed on the first dielectric material; and a second dielectric material is conformally formed on the channel material; performing an anisotropic etching process (e.g., a reactive ion etching (RIE) process) to remove the first dielectric material, the channel material, and the second dielectric material on the top surface 110t of the stack structure 110 and a bottom surface 10bt of the opening 10, thereby forming the dielectric layer 122, the channel layer 124, and the dielectric layer 126 on the sidewall of the opening 10. As shown in FIG. 1B, the channel layer 124 is sandwiched between the dielectric layers 122 and 126. In an embodiment, the dielectric layers 122 and 126 may be sidewall oxide layers, such as silicon oxide layers. In one embodiment, a material of the channel layer 124 includes a semiconductor material having a second conductivity type. The semiconductor material may include doped polysilicon material, such as an N-type doped (N+) polysilicon layer.

Figure 1C:
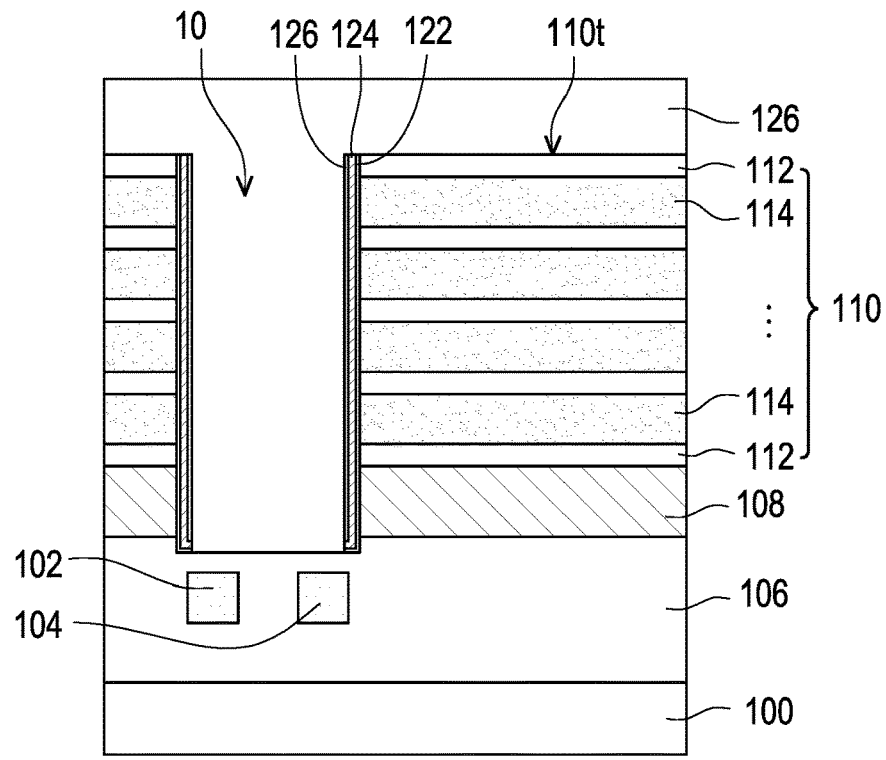

Referring to FIG. 1C, a dielectric material 126 is formed to fill into the opening 10 and extend to cover the top surface 110t of the stack structure 110. In this case, the channel layer 124 may laterally surround the dielectric material 126. In an embodiment, the dielectric material 126 includes silicon oxide, silicon nitride, silicon oxynitride, or other suitable dielectric materials.

Figure 1D:
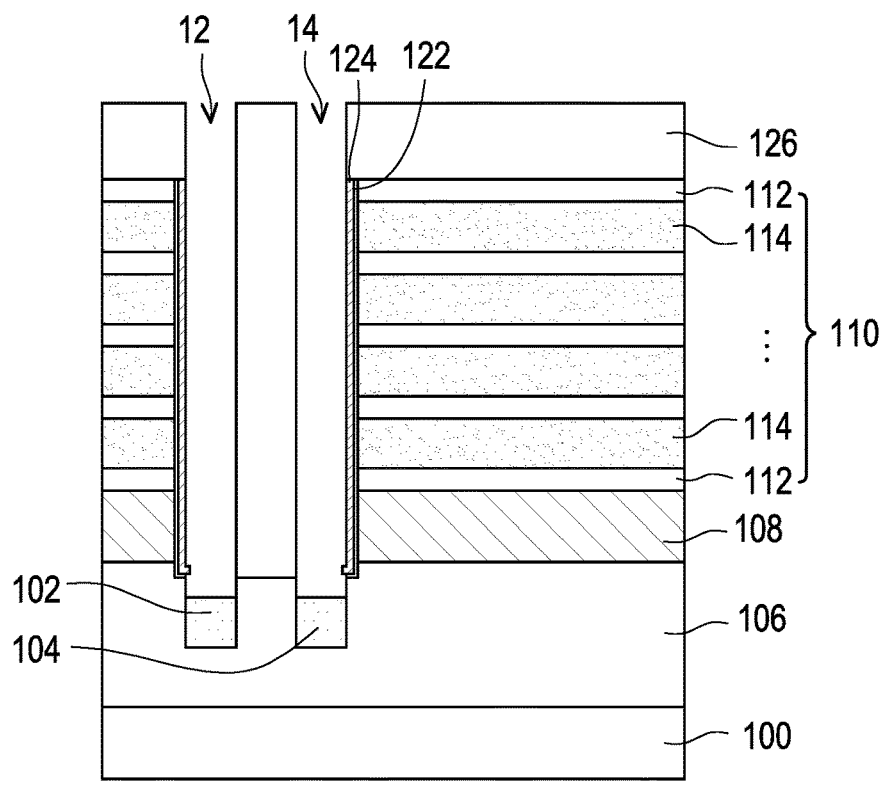

Referring to FIG. 1C and FIG. 1D, the dielectric material 126 is patterned to form an opening 12 (also referred to as second opening) and an opening 14 (also referred to as third opening). In an embodiment, the opening 12 penetrates through the stack structure 110 and exposes the polysilicon layer 102; and the opening 14 penetrates through the stack structure 110 and exposes the polysilicon layer 104. In this case, the polysilicon layer 102 may be regarded as an etching stop layer for forming the opening 12 and the polysilicon layer 104 may be regarded as an etching stop layer for forming the openings 14, so as to avoid over-etching. In addition, the dielectric layer 126 may also be removed during the step of patterning the dielectric material 126, so that the surface of the channel layer 124 is exposed by the openings 12 and 14.

Figure 1E:
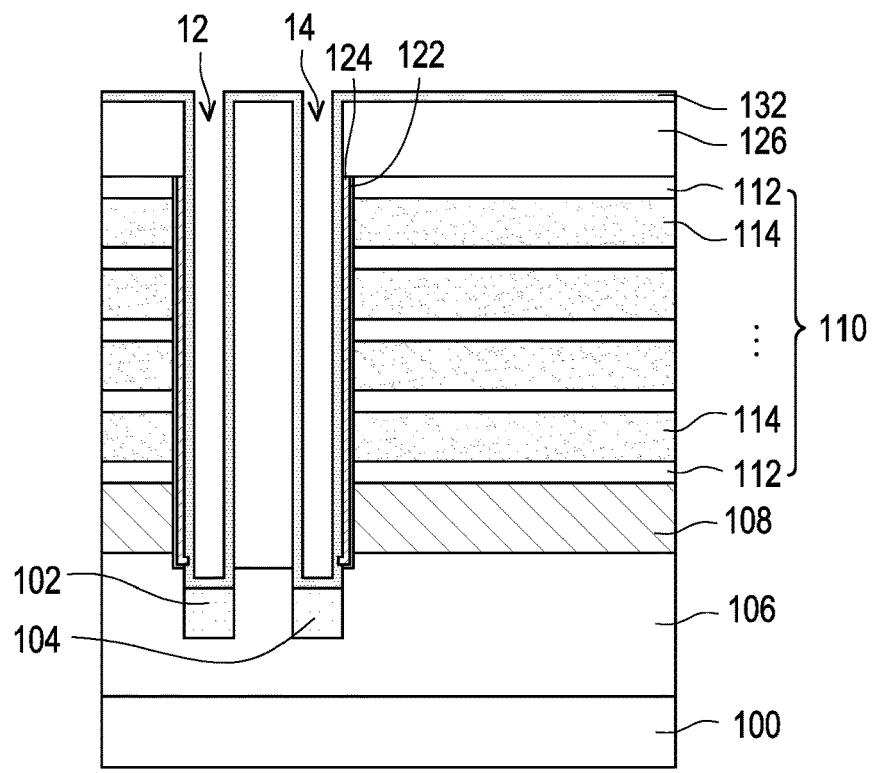

Referring to FIG. 1E, a semiconductor material 132 having a first conductivity type different from the second conductivity type is formed in the openings 12 and 14. In an embodiment, the semiconductor material 132 conformally covers the bottom surfaces and sidewalls of the openings 12 and 14, and extends to cover the top surface of the dielectric material 126. In one embodiment, the semiconductor material 132 includes a doped polysilicon material with the first conductivity type, such as a P-type doped (P+) polysilicon layer.

Figure 1F:
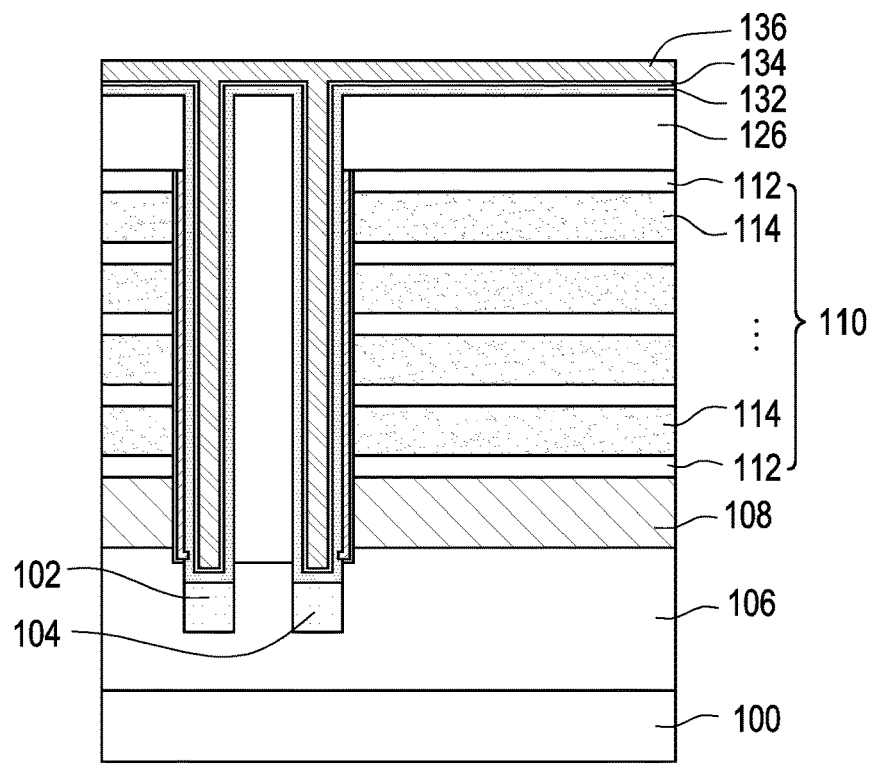

Referring to FIG. 1F, a barrier material 134 and a metal material 136 are formed on the semiconductor material 132. In an embodiment, the barrier material 134 conformally covers the bottom surfaces and sidewalls of the openings 12 and 14, and extends to cover the top surface of the dielectric material 126; and the metal material 136 fills up the openings 12 and 14, and extends to cover the top surface of the dielectric material 126. In one embodiment, the barrier material 134 includes titanium (Ti), titanium nitride (TiN), tantalum (Ta), tantalum nitride (TaN), or a combination thereof, and the metal material 136 includes tungsten or a tungsten alloy.

Figure 1G:
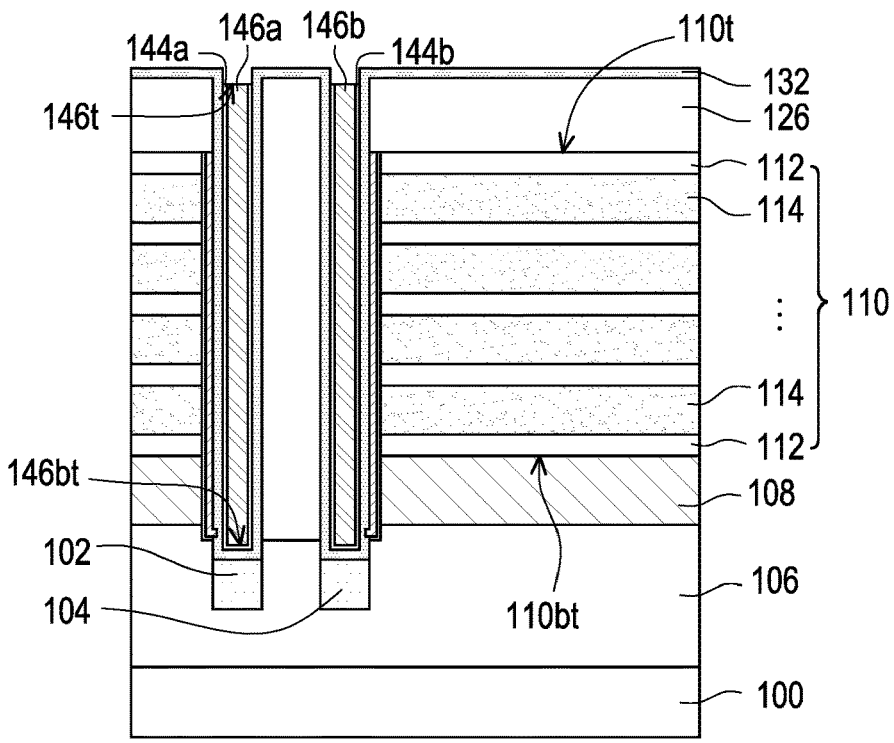

Referring to FIG. 1F and FIG. 1G, a first etch-back process is performed to remove a portion of the metal material 136 and a portion of the barrier material 134 to expose the top surface of the semiconductor material 132 over the stack structure 110. After the first etch-back process, a first buffer pillar 146a and a first barrier layer 144a wrapping the first buffer pillar 146a may be formed in the opening 12; while a second buffer pillar 146b and a second barrier layer 144b wrapping the second buffer pillar 146b may be formed in the opening 14.

Figure 1H:
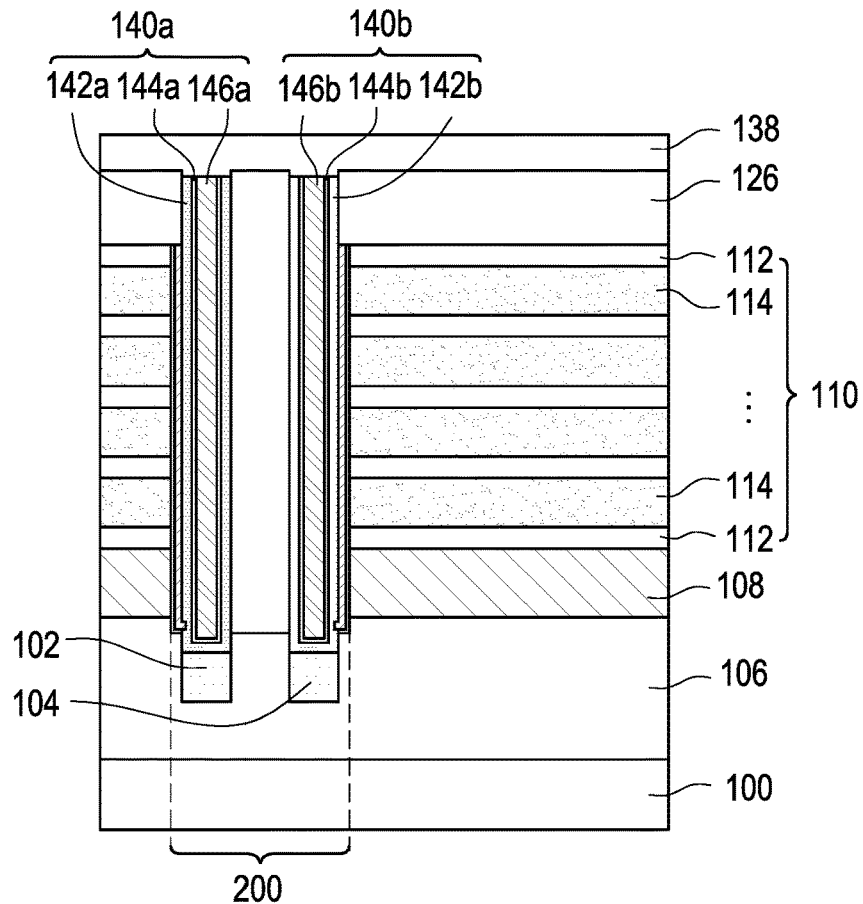

Referring to FIG. 1G and FIG. 1H, a second etch-back process is performed to remove a portion of the semiconductor material 132 to form a first source/drain pillar 140a in the opening 12 and a second source/drain pillar 140b in the opening 14, thereby forming a vertical channel pillar 200. Specifically, the vertical channel pillar 200 may include the first source/drain pillar 140a, the second source/drain pillar 140b, and the channel layer 124 laterally surrounding the first source/drain pillar 140a and the second source/drain pillar 140b. In an embodiment, the first source/drain pillar 140a includes a first buffer pillar 146a, a first semiconductor layer 142a wrapping the first buffer pillar 146a, and a first barrier layer 144a between the first buffer pillar 146a and the first semiconductor layer 142a. The first buffer pillar 146a may have a bottom surface lower than a bottom surface of the stack structure 110, and the first buffer pillar 146a may have a top surface higher than the top surface of the stack structure 110. The resistance value of the first buffer pillar 146a may be lower than the resistance value of the first semiconductor layer 142a. The thickness of the first semiconductor layer 142a may be 5 nm to 100 nm. Herein, the said thickness may be a radial thickness, namely, the shortest distance measured from the interface between the channel layer 124 and the first semiconductor layer 142a to the interface between the first semiconductor layer 142a and the first barrier layer 144a. In one embodiment, the second source/drain pillar 140b includes a second buffer pillar 146b, a second semiconductor layer 142b wrapping the second buffer pillar 146b, and a second barrier layer 144b between the second buffer pillar 146b and the second semiconductor layer 142b. The second buffer pillar 146b may have a bottom surface lower than the bottom surface of the stack structure 110, and the second buffer pillar 146b may have a top surface higher than the top surface of the stack structure 110. The resistance value of the second buffer pillar 146b may be lower than the resistance value of the second semiconductor layer 142b. The (radial) thickness of the second semiconductor layer 142b may be 5 nm to 100 nm. After forming the first source/drain pillars 140a and the second source/drain pillars 140b, a cap layer 138 may be further formed to cover the top surface of the first source/drain pillars 140a, the top surface of the second source/drain pillars 140b, and the top surface of the dielectric material 126. In an embodiment, the cap layer 138 may be a silicon oxide layer.

Figure 1I:
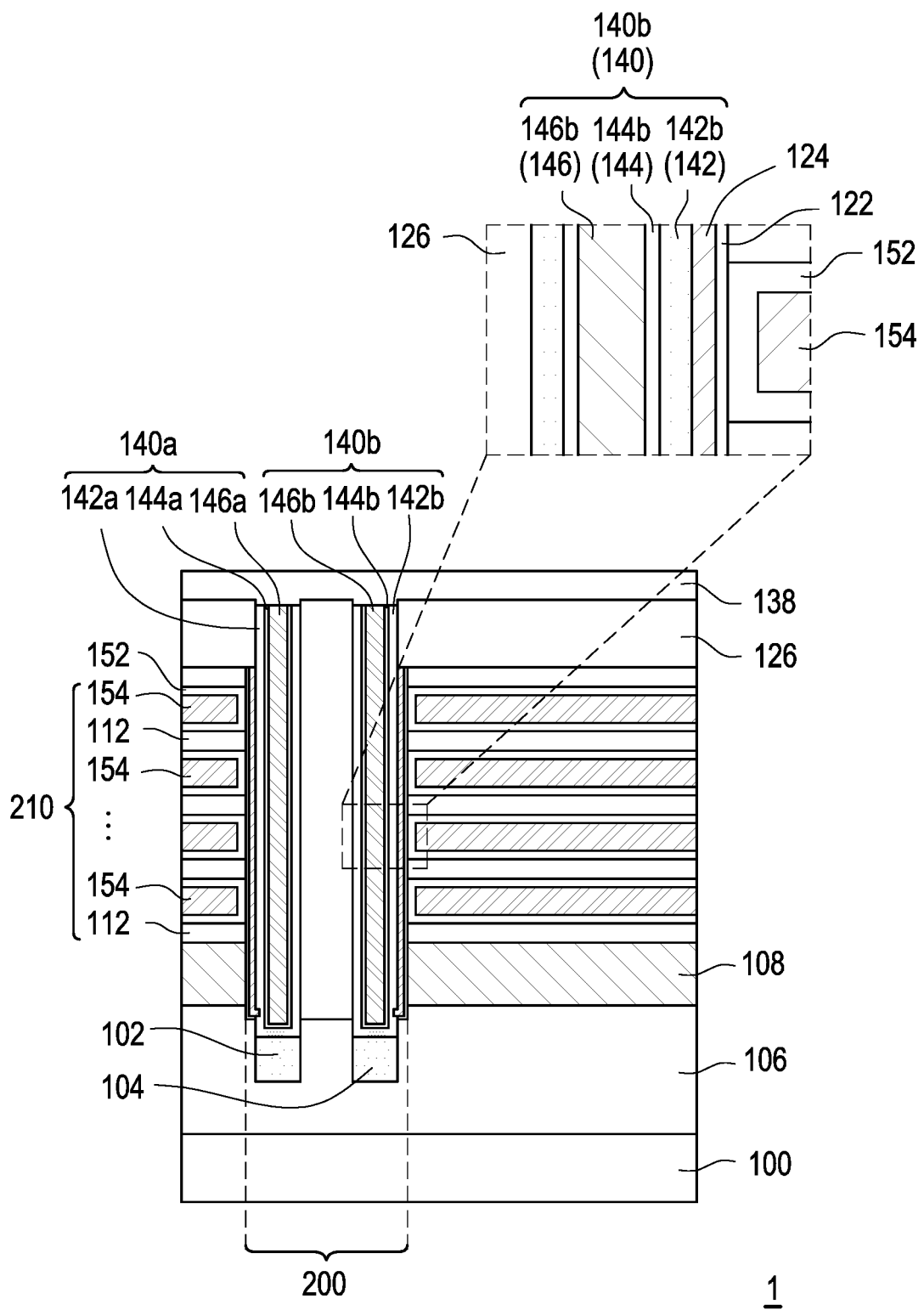

Referring to FIG. 1H and FIG. 1I, after forming the vertical channel pillar 200, a gate replacement process may be performed to replace the sacrificial layers 114 in the stack structure 110 by a plurality of gate layers 154. Specifically, the gate replacement process may include following steps: forming a slit (not shown) in the stack structure 110 next to the vertical channel pillar 200; performing an etching process to remove the sacrificial layers 114 to form a plurality of gaps between the dielectric layers 112; sequentially forming a charge storage structure 152 and the gate layers 154 in the gaps, thereby accomplishing the 3D memory device 1 of the present invention. In an embodiment, the charge storage structure 152 may be a composite layer of a tunneling layer, a charge storage layer and a block layer. The tunneling layer, the charge storage layer and the block layer may refer to oxide/nitride/oxide (ONO), respectively. In another embodiment, the tunneling layer may be a composite layer of oxide/nitride/oxide/(ONO), or other suitable materials. In alternative embodiments, the charge storage layer may be a composite layer of oxide/nitride/oxide (ONO), or other suitable materials. In other embodiments, the block layer may be a composite layer of oxide/nitride/oxide (ONO), or other suitable materials. A material of the gate layers 154 is, for example, polysilicon, amorphous silicon, tungsten (W), cobalt (Co), aluminum (Al), tungsten silicide ($WSi_x$), or cobalt silicide ($CoSi_x$). In some embodiments, after forming the charge storage structure 152 and before forming the gate layers 154, a buffer layer and a barrier layer may be sequentially formed between the charge storage structure 152 and the gate layers 154. A material of the buffer layer is made of, for example, a material with a high dielectric constant of a dielectric constant greater than 7, such as aluminum oxide ($Al_2O_3$), hafnium oxide ($HfO_2$), lanthanum oxide ($La_2O_5$), transition metal oxide, lanthanide oxide, or a combination thereof. A material of the barrier layer is made of, for example, titanium (Ti), titanium nitride (TiN), tantalum (Ta), tantalum nitride (TaN), or a combination thereof.

It should be noted that, in the present embodiment, using the buffer pillar 146 with the low-resistance as the source/drain pillar 140 can effectively reduce the resistance of the source/drain pillar 140, thereby increasing the operating speed of the device. In addition, in the present embodiment, the semiconductor layer 142 is formed between the buffer pillar 146 and the channel layer 124 and in contact with the channel layer 124, and the semiconductor layer 142 is designed to have the conductivity type different from that of the channel layer 124. In one embodiment, the semiconductor layer 142 has positive charge carriers and the channel layer 124 has negative charge carriers. In this case, the semiconductor layer 142 can be configured to prevent the carrier from moving between the buffer pillar 146 and the channel layer 124 in the off-state, so as to effectively reduce the leakage current of the device, thereby improving the device performance. For example, when the semiconductor layer 142 is the P-type doped (P+) polysilicon layer and the channel layer 124 is the N-type doped (N+) polysilicon layer, electrons are blocked by the semiconductor layer 142 without moving between the buffer pillar 146 and the channel layer 124 in the case that the voltage is not applied to the source/drain pillar 140 and the gate layer 154. That is, if the semiconductor layer 142 is omitted, electrons can easily move between the buffer pillar 146 and the channel layer 124 in the case of not applying any voltage, thereby causing an increase in leakage current. Therefore, the present invention chooses to use the semiconductor layers 142 with the conductivity type different from the channel layer 124, so as to effectively improve the device performance. Further, in the present embodiment, the barrier layer 144 is also formed between the buffer pillar 146 and the semiconductor layer 142 to increase the adhesion therebetween.

Figure 5:
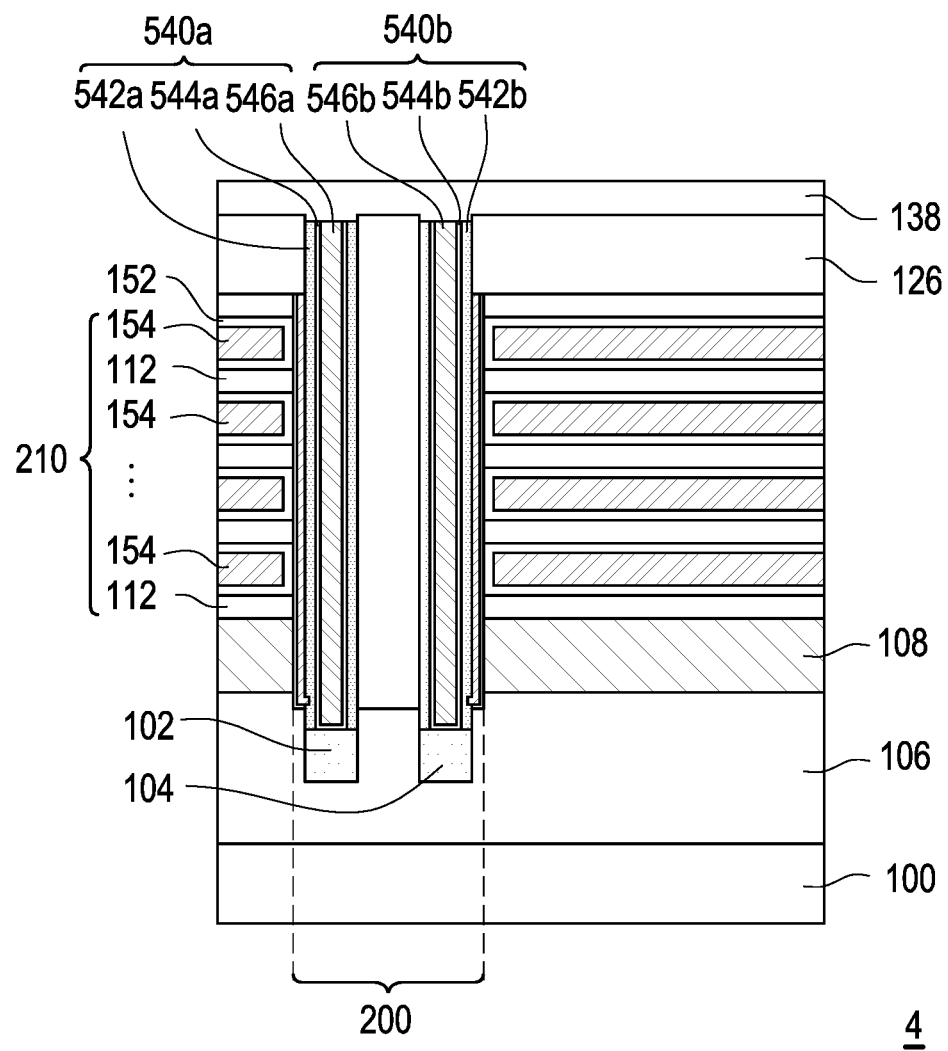
FIG. 5 is a schematic cross-sectional view of a 3D memory device according to alternative embodiments of the invention.

It should be noted that the semiconductor layer 142 illustrated in FIG. 1I presents a U-shaped structure in a cross-sectional view. In detail, the semiconductor layer 142 not only laterally wraps the sidewall of the buffer pillar 146, but also extends to cover the bottom surface of the buffer pillar 146. However, the present invention is not limited thereto, in alternative embodiments, the semiconductor layer may also be a vertical tube structure. Specifically, as shown in FIG. 5, a first buffer pillar 546a and a first barrier layer 544a of the 3D memory device 4 may penetrate through a first semiconductor layer 542a to contact the underlying polysilicon layer 102, and the first semiconductor layer 542a only laterally wraps the sidewall of the first buffer pillar 546a. Similarly, a second buffer pillar 546b and a second barrier layer 544b may penetrate through a second semiconductor layer 542b to contact the underlying polysilicon layer 104, and the second semiconductor layer 542b only laterally wraps the sidewall of the second buffer pillar 546b.

Figure 2A:
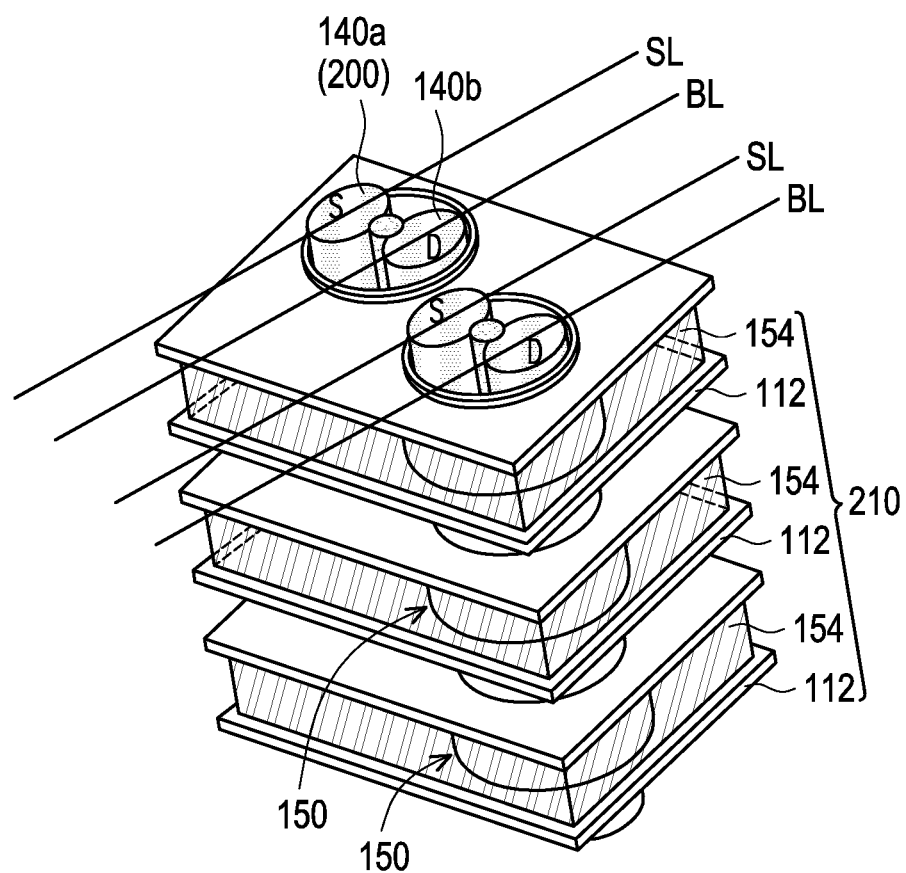
FIG. 2A, FIG. 2B, and FIG. 2C are respectively a schematic perspective view, a schematic plan view, and a schematic circuit diagram of a 3D AND flash memory according to an embodiment of the present invention.
Figure 2B:
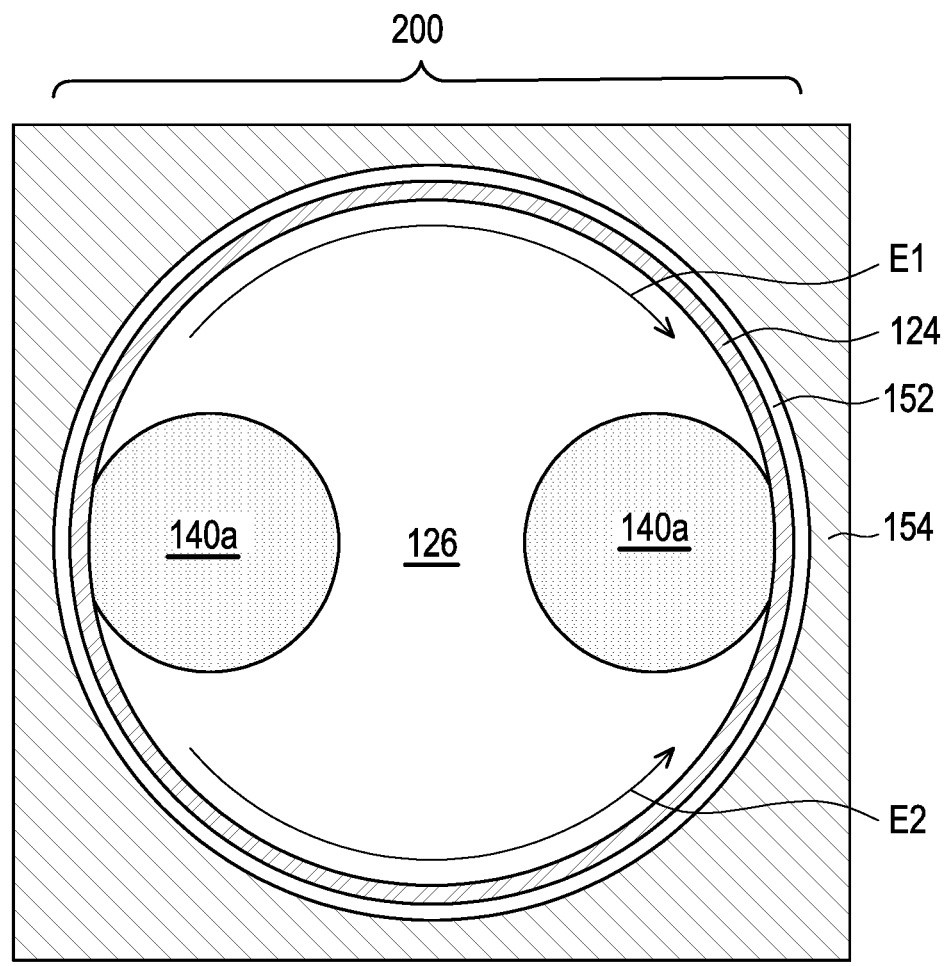
Figure 2C:
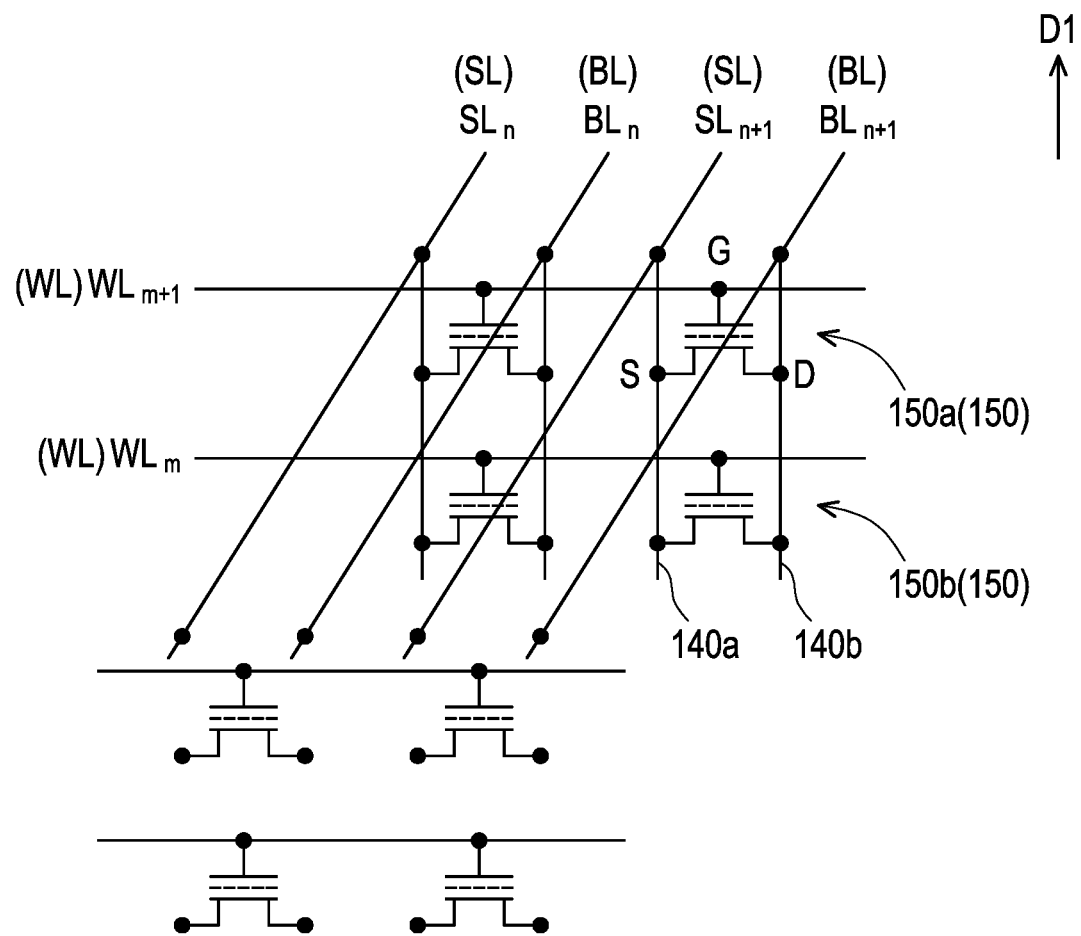

FIG. 2A, FIG. 2B, and FIG. 2C are respectively a schematic perspective view, a schematic plan view, and a schematic circuit diagram of a 3D AND flash memory 1 according to an embodiment of the present invention.

Referring to FIG. 2A, in the present embodiment, the 3D AND flash memory 1 has a plurality of memory cells 150. In detail, as shown in FIG. 2A, a plurality of gate layers 154 are alternately arranged along the vertical direction, and surround the vertical channel pillars 200 respectively. A portion of the vertical channel pillar 200 surrounded by the gate layer 154 may constitute a memory cell 150. In the present embodiment, a single vertical channel pillar 200 may define three memory cells 150 stacked on each other. However, the present invention is not limited thereto. In other embodiments, the number of memory cells 150 may be adjusted according to the number of gate layers 154 in the stack structure 210. Furthermore, the memory cell 150 may be formed at the intersection of the gate layer 154 and the vertical channel pillar 200. Therefore, the greater the number of vertically stacked gate layers 154, the greater the number of memory cells 150 in the memory string. In addition, although only two vertical channel pillars 200 are illustrated in FIG. 2A, the present invention is not limited thereto. In alternative embodiments, the 3D AND flash memory 1 may include a plurality of vertical channel pillars 200, and these vertical channel pillars 200 may be arranged in an array in the top view.

In order to operate the 3D AND flash memory 1, after the 3D AND flash memory 1 is manufactured, conductive lines are formed on the 3D AND flash memory 1 to be electrically connected to the 3D AND flash memory 1. In the present embodiment, as shown in FIG. 2A, some conductive lines are formed above the first S/D pillar 140a as the source to serve as the source lines SL, and other conductive lines are formed above the second S/D pillar 140b as the drain to serve as the bit lines BL, and these source lines SL and bit lines BL are arranged in parallel to each other without contacting each other.

An operation of the memory cell 150 in the 3D AND flash memory 1 will be described below.

As shown in FIG. 2B, for the 3D AND flash memory 1, each memory cell 150 may be operated individually. An operation voltage may be applied to the first S/D pillar 140a, the second S/D pillar 140b and the corresponding gate layer 154 (which may be regarded as a gate or a word line) of the memory cell 150 for writing (programming) operation, reading operation or erasing operation. When a writing voltage is applied to the first S/D pillar 140a and the second S/D pillar 140b, since the first S/D pillar 140a and the second S/D pillar 140b are connected to the channel layer 124, an electron may be transmitted along a first electrical path E1 and a second electrical path E2 (e.g., a double-sided electrical path) and stored in the entire charge storage structure 152.

In addition, referring to FIG. 2C, in the present embodiment, the memory cells 150 may be arranged in a plurality of columns and a plurality of rows to form a 3D AND flash memory array. Each memory cell 150 may include a gate G electrically connected to the word line WL (i.e., WLm, WLm+1), a source S electrically connected to the source line SL (i.e., SLn, SLn+1), and a drain D electrically connected to the bit line BL (i.e., BLn, BLn+1). It should be noted that in the 3D AND flash memory array of the present embodiment, a plurality of memory cells 150 along the extending direction D1 of the S/D pillars 140a and 140b may be connected in parallel with each other. Specifically, as shown in FIG. 2C, the upper memory cell 150a and the lower memory cell 150b share the same source line SLn+1 and the same bit line BLn+1 through the common S/D pillars 140a and 140b, and the gate of the upper memory cell 150a is electrically connected to the upper word line WLm+1, and the gate of the lower memory cell 150b is electrically connected to the lower word line WLm. In this case, the architecture and operation method of the 3D AND flash memory array of the present embodiment are different from those of the conventional 3D NAND flash memory array, wherein the conventional 3D NAND flash memory array includes a plurality of memory cells connected in series.

FIG. 3A to FIG. 3D are schematic cross-sectional views of a manufacturing process of a 3D memory device 2 according to another embodiment of the invention.

Figure 3A:
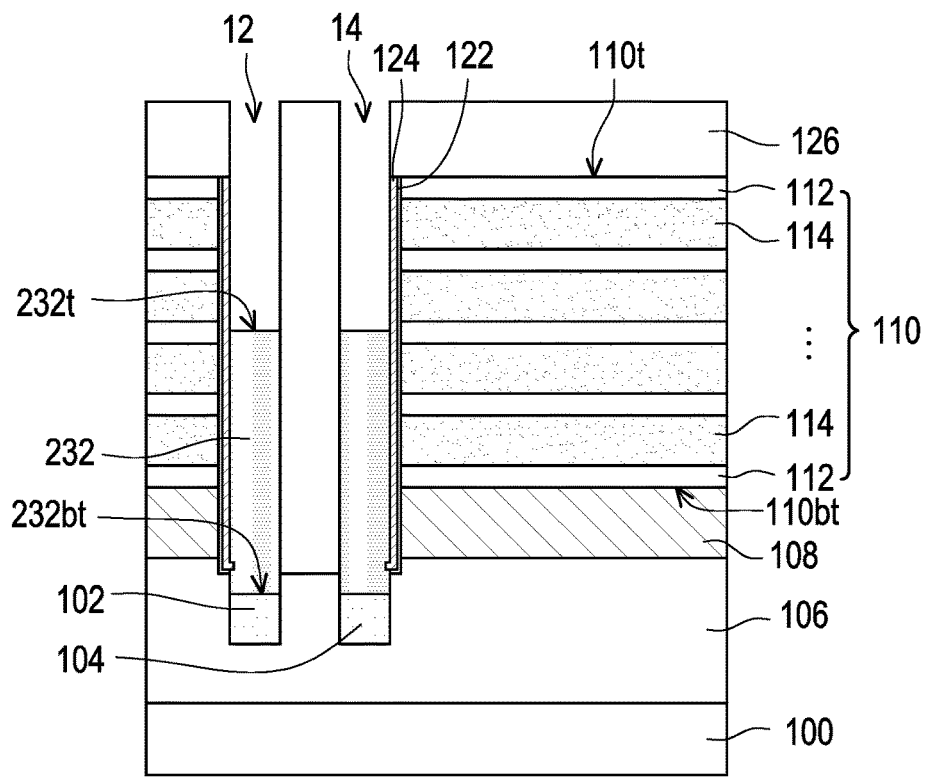
FIG. 3A to FIG. 3D are schematic cross-sectional views of a manufacturing process of a 3D memory device according to another embodiment of the invention.

FIG. 3A illustrates the structure following FIG. 1D to form lower semiconductor layers 232 having the first conductivity type different from the second conductivity type in the openings 12 and 14. In an embodiment, a top surface 232t of the lower semiconductor layers 232 is between the top surface 110t and the bottom surface 110bt of the stack structure 110, and a bottom surface 232bt of the lower semiconductor layers 232 is lower than the bottom surface 110bt of the stack structure 110. In one embodiment, the lower semiconductor layers 232 include a doped polysilicon material having the first conductivity type, such as a P-type doped (P+) polysilicon layer.

Figure 3B:
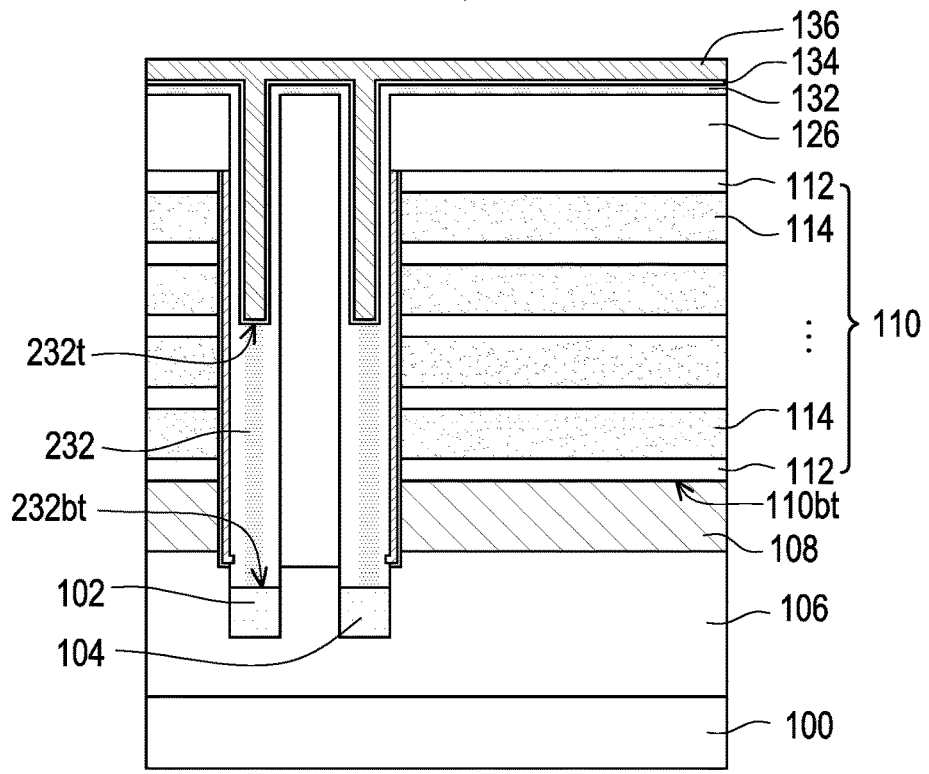

Referring to FIG. 3B, a semiconductor material 132 having the first conductivity type different from the second conductivity type is formed in the openings 12, 14, so that the semiconductor material 132 and the lower semiconductor layers 232 conformally cover the openings 12 and 14 and contact the top surfaces 232t of the lower semiconductor layers 232. In the present embodiment, the semiconductor material 132 and the lower semiconductor layers 232 have the same material, such as a P-type doped (P+) polysilicon layer. Next, a barrier material 134 and a metal material 136 are sequentially formed on the semiconductor material 132. In an embodiment, the barrier material 134 conformally covers the openings 12 and 14 and extends over the top surface of the dielectric material 126; and the metal material 136 fills up the openings 12 and 14 and extends to cover the top surface of the dielectric material 126. In one embodiment, the barrier material 134 includes titanium (Ti), titanium nitride (TiN), tantalum (Ta), tantalum nitride (TaN) or a combination thereof, and the metal material 136 includes tungsten or a tungsten alloy.

Figure 3C:
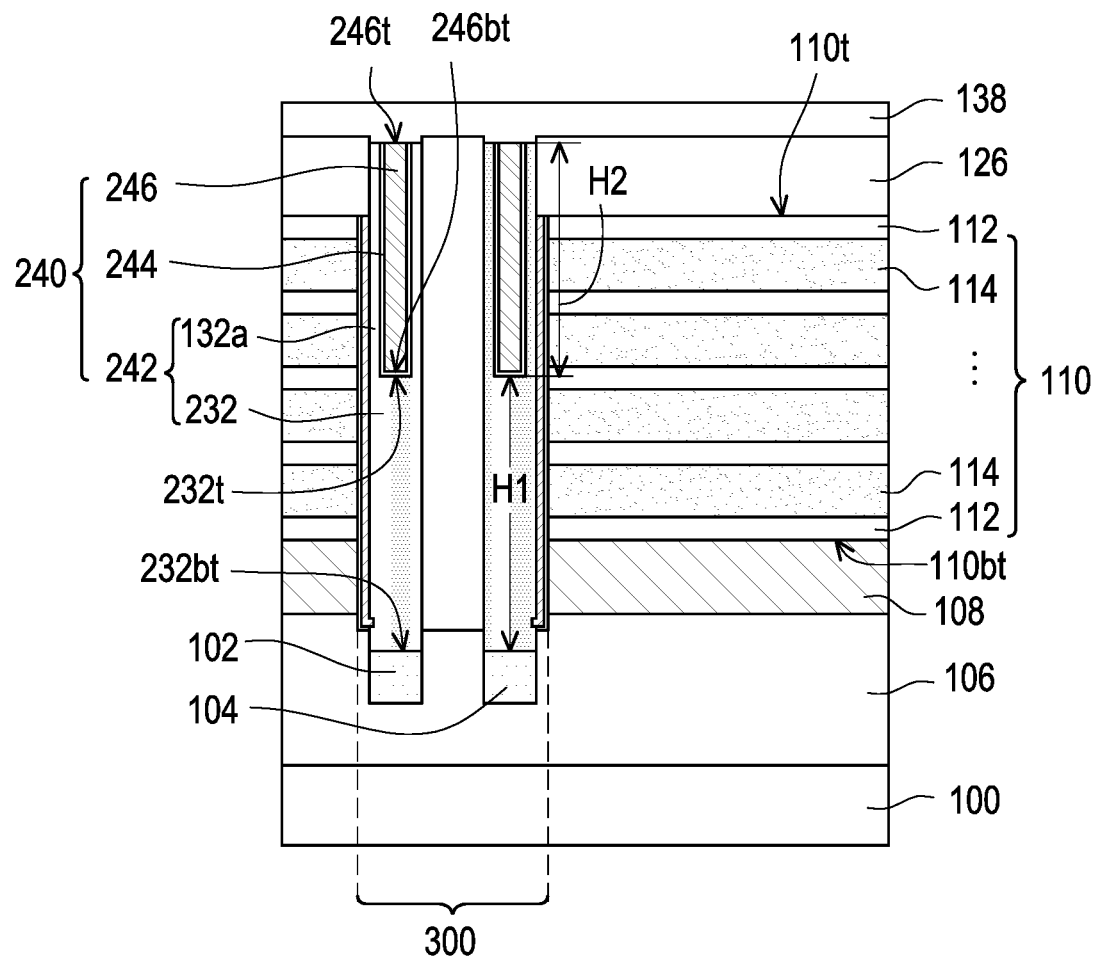

Referring to FIG. 3B and FIG. 3C, an etch-back process is performed to remove a portion of the metal material 136, a portion of the barrier material 134, and a portion of the semiconductor material 132 to form the source/drain pillars 240 in the openings 12 and 14, thereby forming a vertical channel pillar 300. Specifically, the vertical channel pillar 300 may include two source/drain pillars 240 and a channel layer 124 laterally surrounding the two source/drain pillars 240. In one embodiment, each source/drain pillar 240 includes a buffer pillar 246, a semiconductor structure 242 wrapping the buffer pillar 246, and a barrier layer 244 between the buffer pillar 246 and the semiconductor structure 242. The buffer pillar 246 may have a bottom surface between the bottom surface 110bt and the top surface 110t of the stack structure 110, and the buffer pillar 246 may have a top surface higher than the top surface 110t of the stack structure 110. The resistance value of the buffer pillar 246 may be lower than the resistance value of the semiconductor structure 242. The semiconductor structure 242 may include a lower semiconductor layer (also referred to as a lower portion) 232 and an upper semiconductor layer (also referred to as an upper portion) 132a. The upper semiconductor layer 132a may extend upward from the top surface 232t of the lower semiconductor layer 232 to laterally surround the sidewall of the buffer pillar 246, while the lower semiconductor layer 232 covers the bottom surface of the buffer pillar 246. Specifically, the upper semiconductor layer 132a may extend between the sidewall of the buffer pillar 246 and the dielectric layer 126, the stack structure 110. In this case, the semiconductor structure 242 may also be regarded as a U-shaped structure which wraps the sidewall and the bottom surface of the buffer pillar 246 simultaneously. In addition, although the semiconductor structure 242 illustrated in FIG. 3C is the U-shaped structure, the present invention is not limited thereto. In other embodiments, the semiconductor structure may also be a vertical tube structure, as shown in FIG. 5. In one embodiment, a ratio (H1/H2) of the height H1 of the lower semiconductor layer 232 to a height H2 of the buffer pillar 246 is between 0.01 and 0.99. Herein, the said height H1 is the distance between the top surface 232t and the bottom surface 232bt of the lower semiconductor layer 232, and the said height H2 is the distance between the top surface 246t and the bottom surface 246bt of the buffer pillar 246. However, the present invention is not limited thereto, in other embodiments, since the buffer pillar 246 and the lower semiconductor layer 232 have different resistance values, the whole resistance value of the source/drain pillar 240 can be adjusted by changing the ratio of the heights H1 and H2 to meet the needs of different products. In other word, the buffer pillar 246 may be used as a buffer structure for adjusting the whole resistance of the source/drain column 240. In addition, after forming the source/drain pillars 240, a cap layer 138 may be further formed to cover the top surface of the two source/drain pillars 240 and the top surface of the dielectric material 126. In one embodiment, the cap layer 138 may be a silicon oxide layer.

Figure 3D:
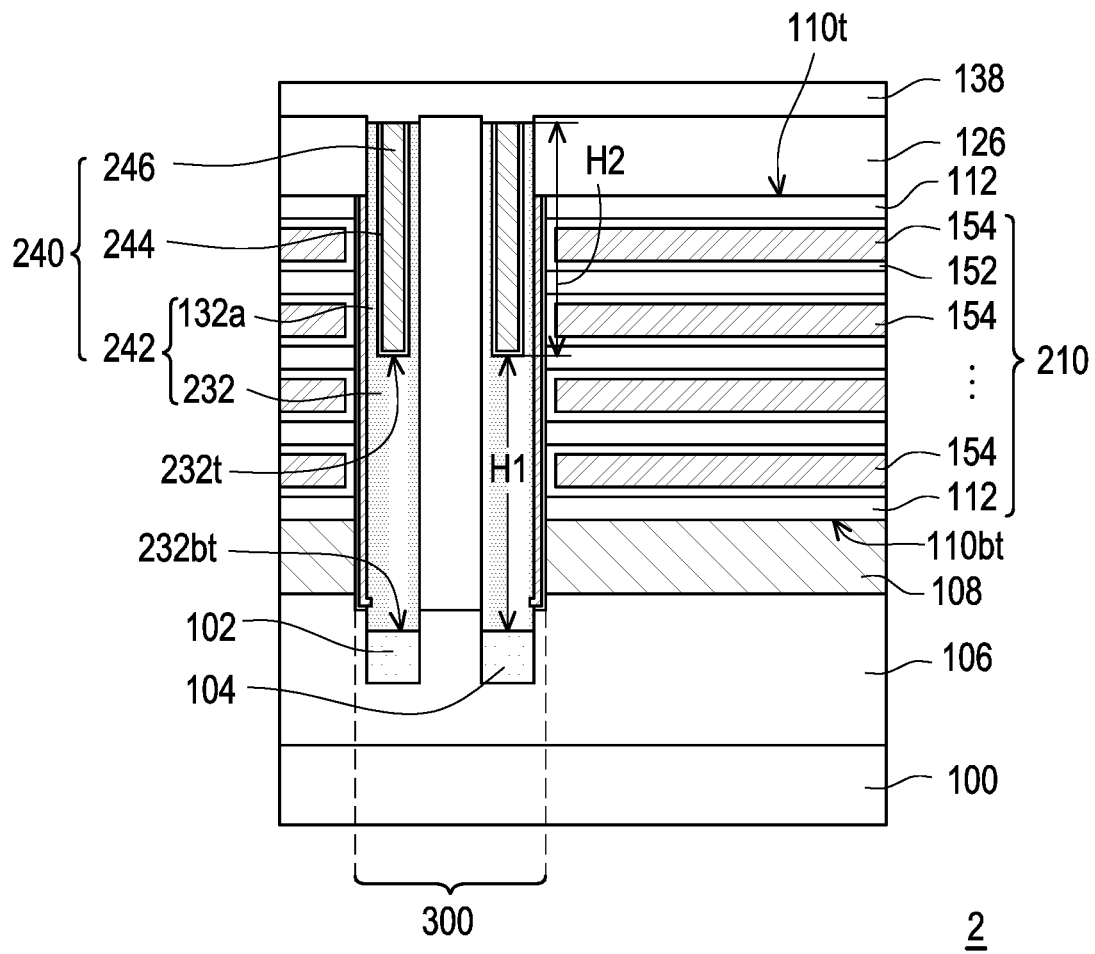

Referring to FIG. 3C and FIG. 3D, after forming the vertical channel pillar 300, a gate replacement process may be performed to replace the sacrificial layers 114 in the stack structure 110 by a plurality of gate layers 154, thereby accomplishing the 3D memory device 2 of the present invention. The process steps of the gate replacement process have been described in detail in the above paragraphs, and will not be repeated here.

The said embodiments are illustrated by using the 3D AND flash memory as an example. However, the embodiments of the present invention are not limited thereto, and the embodiments of the present invention can also be applied to 3D NAND flash memory or 3D NOR flash memory.

Figure 4:
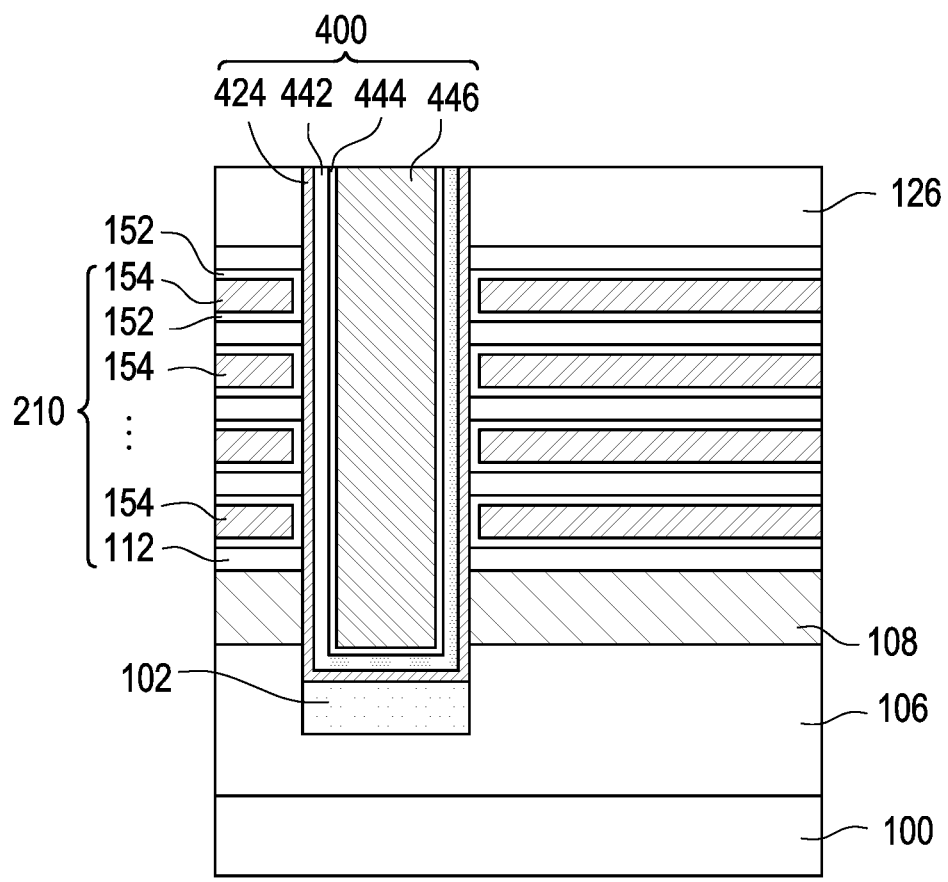
FIG. 4 is a schematic cross-sectional view of a 3D memory device according to other embodiments of the invention.

FIG. 4 is a schematic cross-sectional view of a 3D memory device 3 according to other embodiments of the invention.

Referring to FIG. 4, when the 3D memory device 3 is a 3D NAND flash memory, the vertical channel pillar 400 may include a channel layer 424, a semiconductor layer 442, a barrier layer 444, and a buffer pillar 446. The semiconductor layer 442 may wrap the buffer pillar 446; the barrier layer 444 may be disposed between the buffer pillar 446 and the semiconductor layer 442; the channel layer 424 may wrap the semiconductor layer 442 and be in contact with the stop layer 108 and the polysilicon layer 102. In the present embodiment, the resistance value of the buffer pillar 446 may be lower than the resistance value of the semiconductor layer 442, so as to reduce the overall resistance value of the vertical channel pillar 400, thereby increasing the operating speed of the device. In addition, the semiconductor layer 442 is formed between the buffer pillar 446 and the channel layer 424 and in contact with the channel layer 424, and the semiconductor layer 442 is designed to have a conductivity type different from that of the channel layer 424. In this case, the semiconductor layer 442 can be configured to prevent the carrier from moving between the buffer pillar 446 and the channel layer 424 in the off state, so as to effectively reduce the leakage current of the device, thereby improving the device performance. Furthermore, the charge storage structure 152 may laterally surround the vertical channel pillar 400 in the top view. Although the semiconductor layer 442 illustrated in FIG. 4 is a U-shaped structure, the present invention is not limited thereto. In other embodiments, the semiconductor layer may also be a vertical tube structure, as shown in FIG. 5.

In summary, in the present embodiment, a 3D memory device is provided to have a source/drain pillar which may include a buffer pillar and a semiconductor layer wrapping the buffer pillar. Using the buffer pillar with the low-resistance as the source/drain pillar can effectively reduce the resistance of the source/drain pillar, thereby increasing the operating speed of the device. In addition, the semiconductor layer may be formed between the buffer pillar and the channel layer and in contact with the channel layer, and the semiconductor layer may be designed to have a conductivity type different from that of the channel layer. In this case, the semiconductor layer can be configured to prevent the carrier from moving between the buffer pillar and the channel layer in the off-stage, so as to effectively reduce the leakage current of the device, thereby improving the device performance.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A three-dimensional (3D) memory device, comprising:
    a substrate;
    a stack structure, disposed on the substrate, wherein the stack structure comprises a plurality of dielectric layers and a plurality of gate layers stacked alternately; and
    a vertical channel pillar, penetrating through the stack structure, wherein the vertical channel pillar comprises:
        a first source/drain pillar comprising a first buffer pillar and a first semiconductor layer having a first conductivity type wrapping the first buffer pillar, wherein a resistance value of the first buffer pillar is lower than a resistance value of the first semiconductor layer;
        a second source/drain pillar comprising a second buffer pillar and a second semiconductor layer having the first conductivity type wrapping the second buffer pillar; and
        a channel layer laterally surrounding the first source/drain pillar and the second source/drain pillar, wherein the channel layer comprises a polysilicon layer having a second conductivity type different from the first conductivity type.

2. The 3D memory device according to claim 1, wherein the first source/drain pillar further comprises a first barrier layer disposed between the first buffer pillar and the first semiconductor layer.

3. The 3D memory device according to claim 1, wherein the first semiconductor layer is in contact with the channel layer, the first semiconductor layer has positive charge carriers and the channel layer has negative charge carriers.

4. The 3D memory device according to claim 1, wherein the second source/drain pillar further comprises a second barrier layer disposed between the second buffer pillar and the second semiconductor layer.

5. The 3D memory device according to claim 4, wherein a thickness of the first semiconductor layer is 5 nm to 100 nm, and a thickness of the second semiconductor layer is 5 nm to 100 nm.

6. The 3D memory device according to claim 1, wherein the second semiconductor layer is in contact with the channel layer, the second semiconductor layer has positive charge carriers and the channel layer has negative charge carriers.

7. The 3D memory device according to claim 1, wherein the first buffer pillar has a bottom surface lower than a bottom surface of the stack structure.

8. The 3D memory device according to claim 1, wherein the first buffer pillar has a bottom surface between a top surface and a bottom surface of the stack structure.

9. The 3D memory device according to claim 8, wherein the first semiconductor layer comprises:
    a lower portion having a top surface and a bottom surface opposite to each other, the top surface of the lower portion in contact with the bottom surface of the first buffer pillar, and the bottom surface of the lower portion lower than the bottom surface of the stack structure; and
    an upper portion laterally surrounding a sidewall of the first buffer pillar.

10. The 3D memory device according to claim 9, wherein a ratio (H1/H2) of a height H1 of the lower portion to a height H2 of the first buffer pillar is between 0.01 and 0.99.

* * * * *